US011289493B2

(12) United States Patent
Lin et al.

(10) Patent No.: US 11,289,493 B2
(45) Date of Patent: Mar. 29, 2022

(54) PATTERNING METHOD

(71) Applicant: Winbond Electronics Corp., Taichung (TW)

(72) Inventors: Keng-Ping Lin, Taichung (TW); Tzu-Ming Ou Yang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 174 days.

(21) Appl. No.: 16/671,118

(22) Filed: Oct. 31, 2019

(65) Prior Publication Data

US 2021/0134810 A1 May 6, 2021

(51) Int. Cl.
| | |
|---|---|
| *H01L 27/108* | (2006.01) |
| *H01L 49/02* | (2006.01) |
| *H01L 21/02* | (2006.01) |
| *H01L 21/311* | (2006.01) |
| *H01L 23/58* | (2006.01) |

(52) U.S. Cl.
CPC .. *H01L 27/10894* (2013.01); *H01L 21/02164* (2013.01); *H01L 21/02271* (2013.01); *H01L 21/31116* (2013.01); *H01L 21/31144* (2013.01); *H01L 23/585* (2013.01); *H01L 27/10814* (2013.01); *H01L 27/10855* (2013.01); *H01L 27/10897* (2013.01); *H01L 28/60* (2013.01)

(58) Field of Classification Search
CPC .............. H01L 27/10894; H01L 28/60; H01L 21/02164; H01L 21/02271; H01L 27/10855; H01L 21/31144; H01L 23/585; H01L 27/10814; H01L 27/10897; H01L 21/31116
See application file for complete search history.

(56) References Cited

U.S. PATENT DOCUMENTS

| | | |
|---|---|---|
| 2007/0187358 A1 | 8/2007 | Van Haren et al. |
| 2013/0140265 A1* | 6/2013 | Kim .................. H01L 28/91 216/6 |
| 2016/0351408 A1* | 12/2016 | Im .................. H01L 21/3086 |
| 2017/0213731 A1* | 7/2017 | Yoon .................. H01L 21/02118 |

FOREIGN PATENT DOCUMENTS

| | | |
|---|---|---|
| CN | 101924018 | 3/2012 |
| EP | 2287667 | 2/2011 |
| TW | 428257 | 4/2001 |
| TW | 200503111 | 1/2005 |
| TW | 200742086 | 11/2007 |

OTHER PUBLICATIONS

"Office Action of Taiwan Counterpart Application", dated Sep. 4, 2020, p. 1-p. 4.

* cited by examiner

*Primary Examiner* — Julia Slutsker
(74) *Attorney, Agent, or Firm* — JCIPRNET

(57) ABSTRACT

A patterning method includes sequentially forming a target layer, a first layer, a second layer, a third layer, and a first mask pattern. A first spacer is formed on a sidewall of the first mask layer. The first mask pattern is removed to form a plurality of peripheral openings surrounding a central opening in the first spacer. A rounding process is performed to round the peripheral openings and form a second mask pattern. A portion of the second layer is removed by using the second mask pattern as a mask, so as to form a third mask pattern. A second spacer is formed in the third mask pattern. The third mask pattern is removed. Portions of the first layer and the target layer are removed by using the second spacer as a mask.

14 Claims, 20 Drawing Sheets

PATTERNING METHOD

BACKGROUND OF THE INVENTION

Field of the Invention

The present invention relates to a patterning method, and more particularly to a method of fabricating a landing pad structure.

Description of Related Art

With the progress of science and technology, all kinds of electronic products tend to be light, thin, and small. In this trend, a critical size of DRAM has also been gradually reduced, which has led to denser capacitor contacts and landing pads thereunder, thereby causing many problems, such as inconsistent shape of each landing pad and forming undesired bridge between adjacent landing pads, or the like. In addition, when the integration density of the landing pad increases, the process of fabricating the landing pad becomes more and more complicated, thereby decreasing the process window. Therefore, those skilled in the art will work to improve the integration density of the capacitor contact and the landing pad thereunder, while maintaining the process window and the yield.

SUMMARY OF THE INVENTION

The invention provides a patterning method, which can fabricate a plurality of semiconductor structures with an uniform shape to enhance the integration density of semiconductor structures in a unit area.

The invention provides a patterning method, which can increase the integration density of the semiconductor structure while increasing the process window of the semiconductor structure and improving device yield.

The invention provides a patterning method including the following steps. A conductive layer, a first nitrogen-containing material layer, a first carbon-containing material layer, a second nitrogen-containing material layer, a second carbon-containing material layer, and a photoresist pattern are sequentially formed on a substrate. A portion of the second carbon-containing material layer is removed by using the photoresist pattern as a mask, so as to form a first mask pattern. A first spacer on a sidewall of the first mask pattern is formed. The first mask pattern is removed to form a central opening and a plurality of peripheral openings surrounding the central opening in the first spacer. A rounding process is performed to remove a portion of the second nitrogen-containing material layer, so as to form a second mask pattern.

The invention provides another patterning method including the following steps. A target layer, a first layer, a second layer, a third layer, and a first mask pattern are sequentially formed on a substrate. A first spacer is formed on a sidewall of the first mask layer. The first mask pattern is removed to form a plurality of peripheral openings surrounding a central opening in the first spacer. A rounding process is performed to round the peripheral openings and form a second mask pattern. A portion of the second layer is removed by using the second mask pattern as a mask, so as to form a third mask pattern. A second spacer is formed in the third mask pattern. The third mask pattern is removed. Portions of the first layer and the target layer are removed by using the second spacer as a mask.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The patterning method illustrated in the following embodiments may be regarded as a method of fabricating a semiconductor structure. The semiconductor structure may be a landing pad or a capacitor contact structure of a dynamic random access memory (DRAM), but the invention is not limited thereto.

Figure 1A:
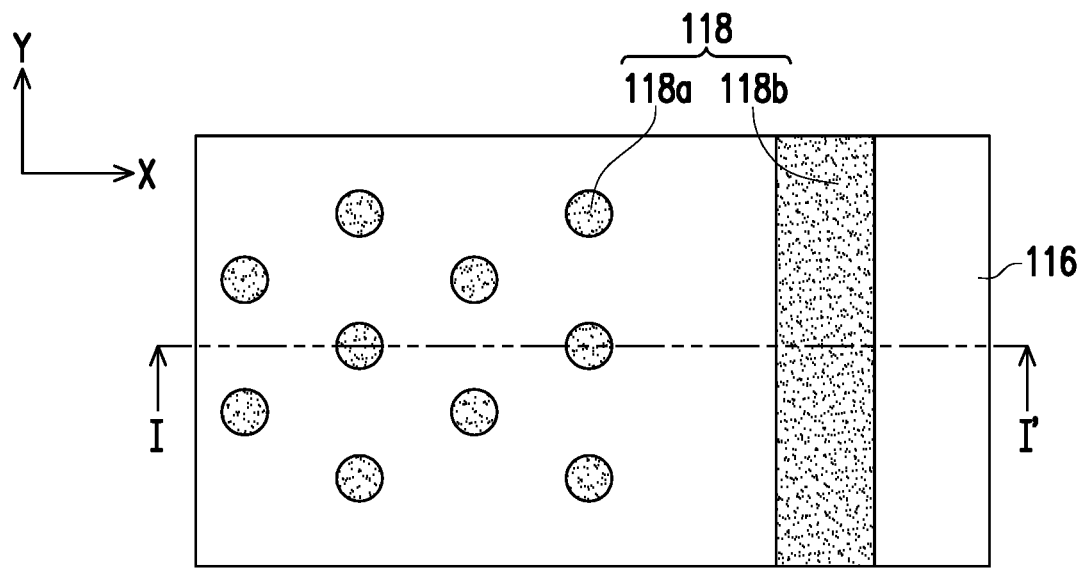
FIG. 1A to FIG. 1K are schematic top views of a manufacturing process of a semiconductor structure according to a first embodiment of the invention.
Figure 2A:
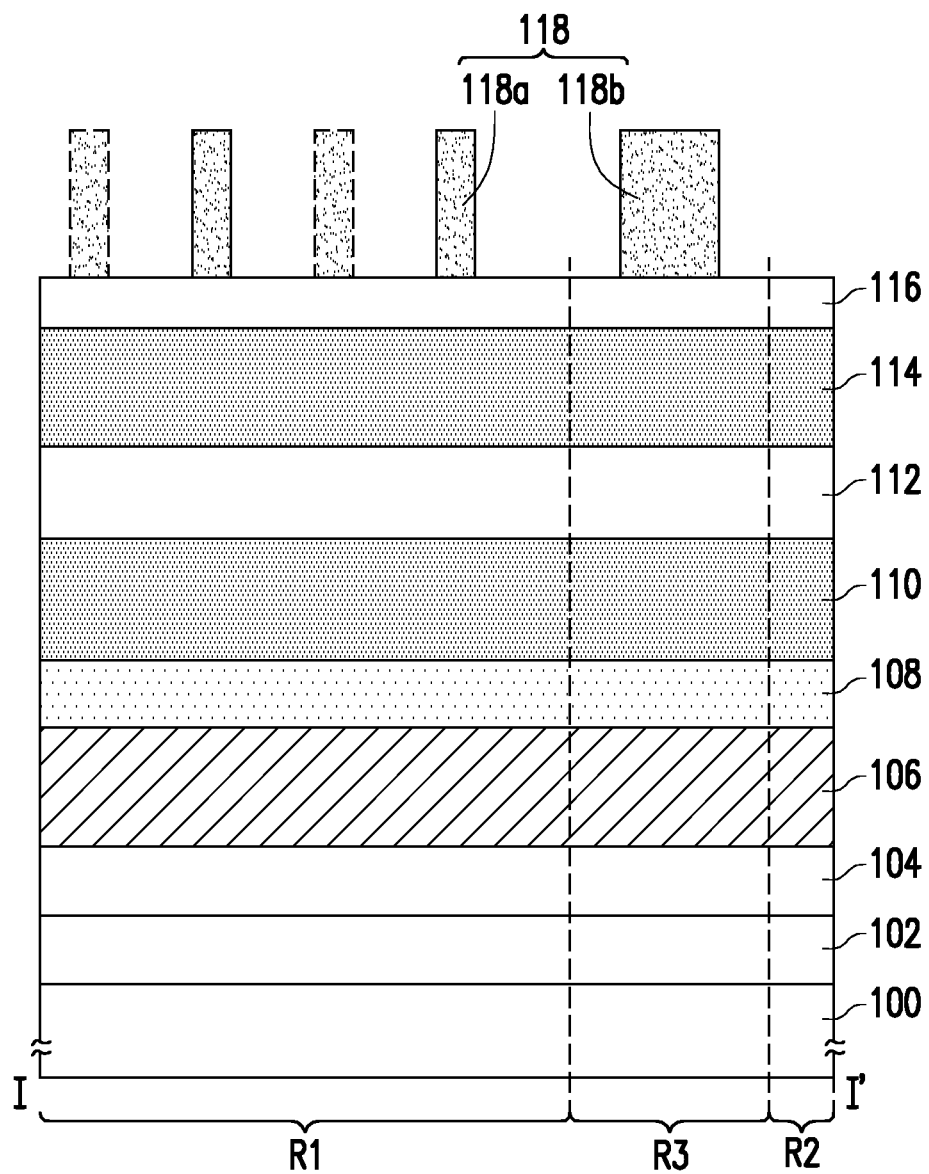
FIG. 2A to FIG. 2K are schematic cross-sectional views taken along line I-I' of FIG. 1A to FIG. 1K.

Referring to FIG. 1A and FIG. 2A, the present embodiment provides a method of fabricating a semiconductor structure including following steps. First, a substitute 100 is provided.

Specifically, as shown in FIG. 2A, the substrate 100 includes a cell region R1, a peripheral region R2, and a guard ring region R3 between the cell region R1 and the peripheral region R2.

As shown in FIG. 2A, a composite layer stack is formed on the substrate 100. The composite layer stack includes a dielectric layer 102, a barrier layer 104, a conductive layer 106, a first nitrogen-containing material layer 108, a first carbon-containing material layer 110, a second nitrogen-containing material layer 112, a second carbon-containing material layer 114, an anti-reflection layer 116, and a photoresist pattern 118 in order from bottom to top.

In an embodiment, the dielectric layer 102 may be a silicon nitride layer that may be formed by using chemical vapor deposition (CVD). A material of the barrier layer 104 may be a metal (e.g., Ti, Ta, etc.) which may be formed by using CVD. A material of the conductive layer 106 may be, for example, a metal (e.g., W, Cu, AlCu, etc.) which may be formed by using CVD. In one embodiment, a material of the first nitrogen-containing material layer 108 and the second nitrogen-containing material layer 112 is, for example, silicon nitride, silicon oxynitride or a combination thereof. The first nitrogen-containing material layer 108 has a thickness of about 30 nm to about 50 nm, and the second nitrogen-containing material layer 112 has a thickness of about 60 nm to about 80 nm. The first nitrogen-containing material layer 108 and the second nitrogen-containing material layer 112 may be formed by CVD or atomic layer deposition (ALD). In an embodiment, a material of the first carbon-containing material layer 110 and the second carbon-containing material layer 114 is, for example, diamond-like carbon, amorphous carbon film, and highly selective transparency film or a combination thereof. The first carbon-containing material layer 110 and the second carbon-containing material layer 114 may have a thickness of about 70 nm to about 100 nm and may be formed by CVD. In one embodiment, a material of the anti-reflection layer 116 includes organic polymer, carbon or silicon oxynitride, etc. The anti-reflection layer 116 may have a thickness of about 20 nm to about 30 nm and may be formed by CVD. In one embodiment, the photoresist pattern 118 includes a positive photoresist, a negative photoresist, etc., which may be formed by using a spin coating process and a development process.

It should be noted that, as shown in FIG. 1A, the photoresist pattern 118 includes photoresist patterns 118a and 118b. The photoresist pattern 118a includes a plurality of island patterns separated from each other in the cell region R1. The photoresist pattern 118b includes a strip pattern extending in an Y direction in the guard ring region R3. In addition, although the line I-I' illustrated in FIG. 1A traverses only two photoresist patterns 118a, there are also a plurality of photoresist patterns 118a (shown as dashed lines) on a cross-sectional view different from the line I-I'.

Figure 1B:
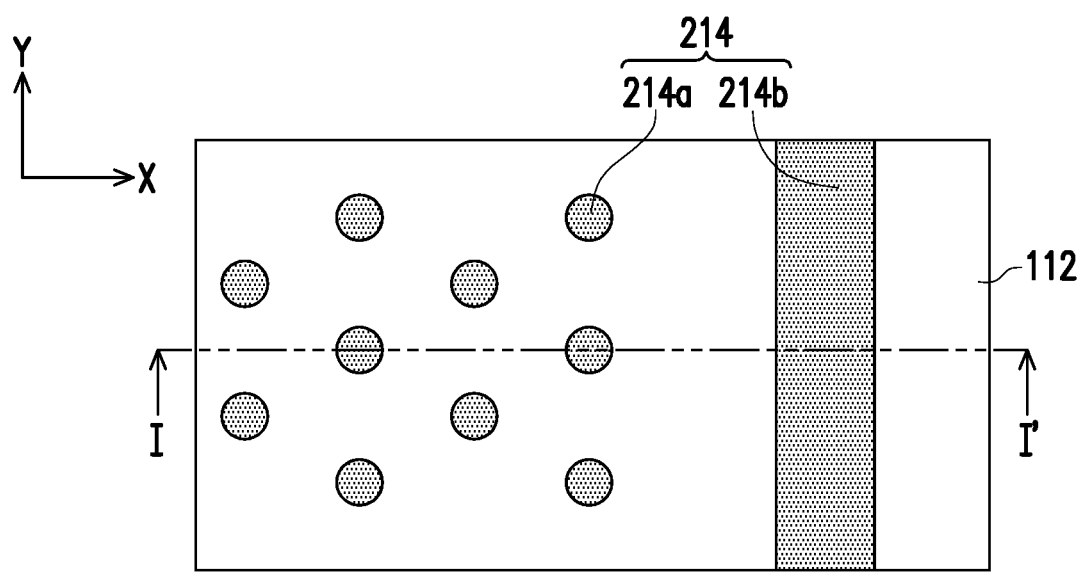
Figure 2B:
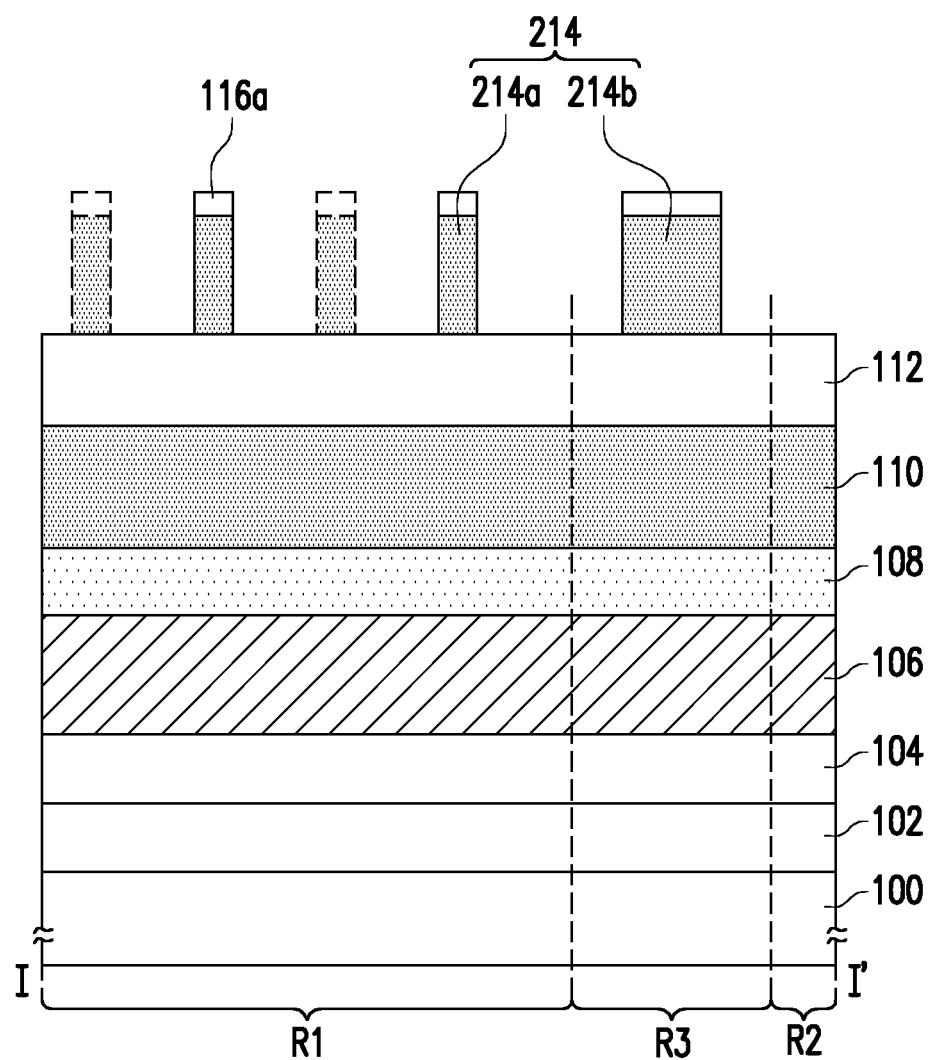

Referring to FIG. 1A to FIG. 1B and FIG. 2A to FIG. 2B, a portion of the anti-reflection layer 116 and a portion of the second carbon-containing material layer 114 are removed by using the photoresist pattern 118 as a mask to form a first mask pattern 214. In the case, as shown in FIG. 1B, the first mask pattern 214 replicates the photoresist pattern 118, which also includes first mask patterns 214a and 214b. The first mask patterns 214a include a plurality of island patterns separated from each other in the cell region R1. The first mask pattern 214b includes a strip pattern extending in the Y direction in the guard ring region R3. In the present embodiment, the second nitrogen-containing material layer 112 may be used as an etching stop layer for forming the first mask pattern 214. In addition, as shown in FIG. 2B, a portion of the anti-reflection layer 116a remains on a top surface of the first mask pattern 214.

Figure 1C:
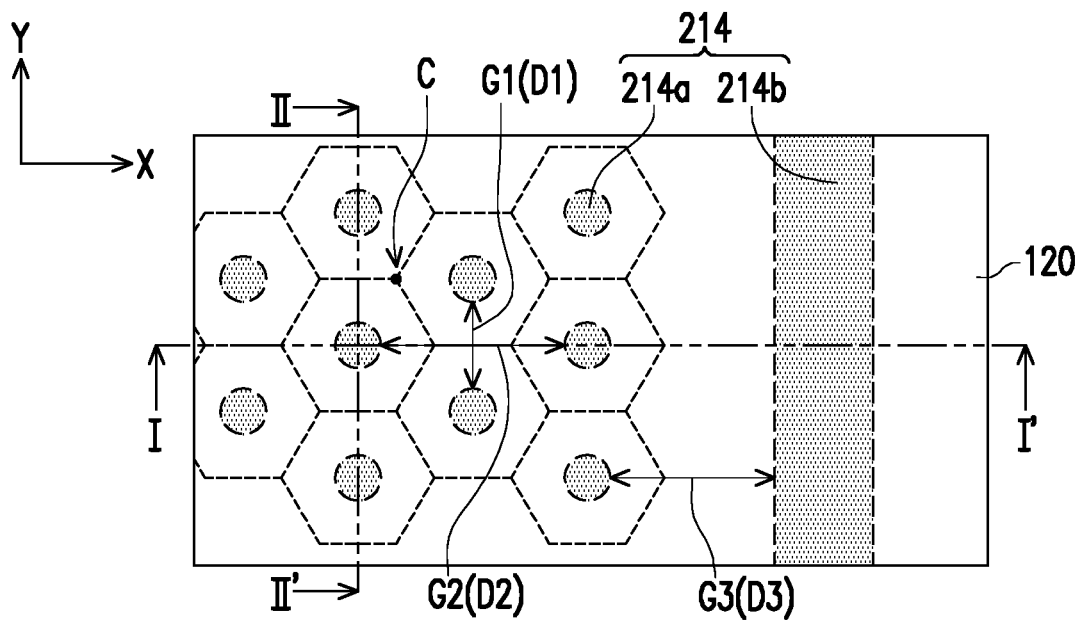
Figure 2C:
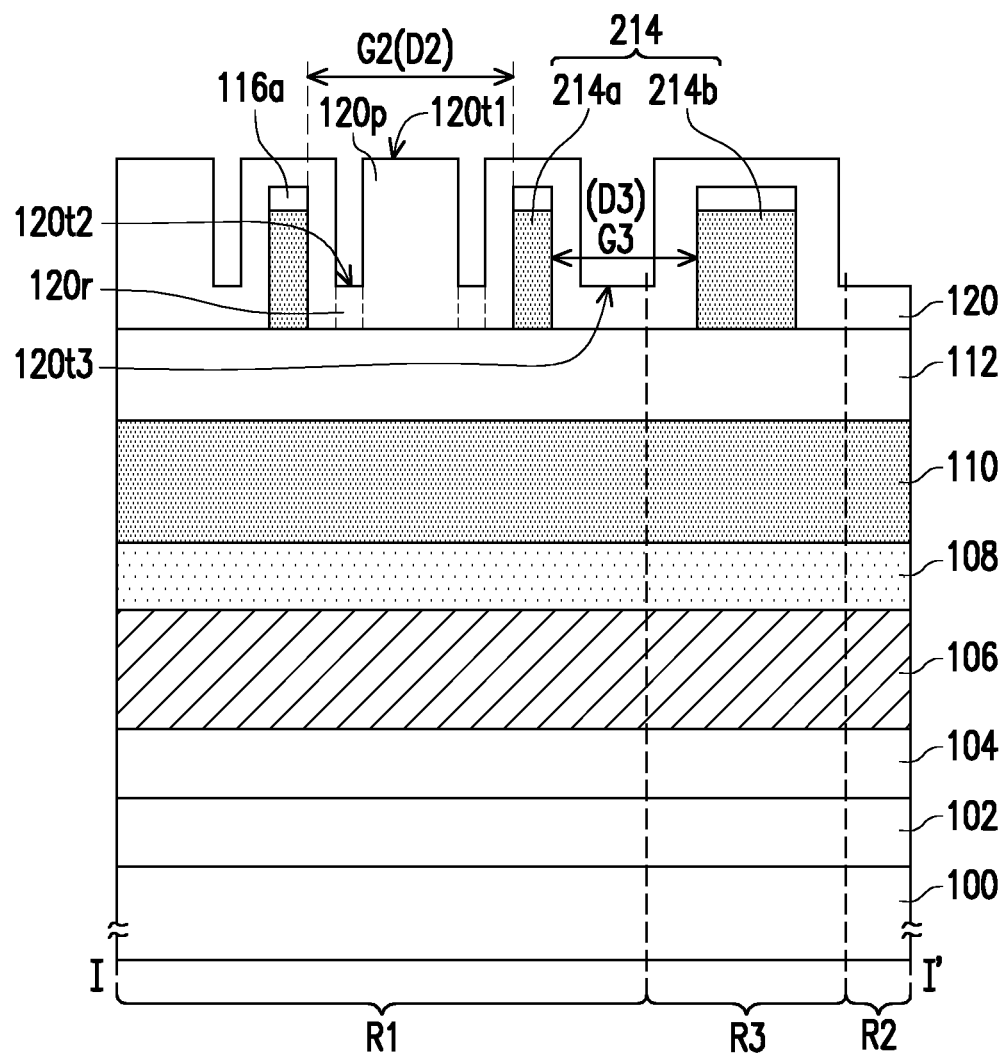
Figure 3:
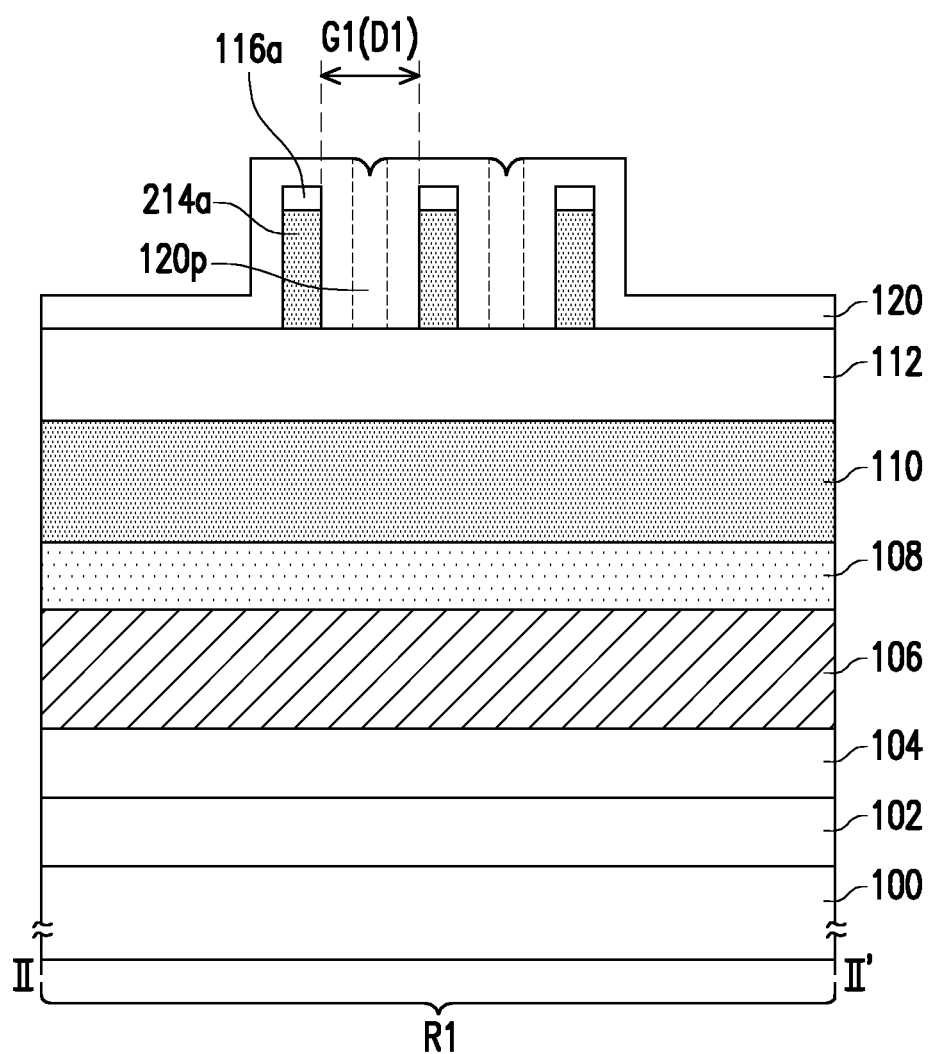
FIG. 3 is a schematic cross-sectional view taken along line II-II' of FIG. 1C.

Referring to FIG. 1C, FIG. 2C and FIG. 3, a first spacer material 120 is formed on the substrate 100 to conformally cover a top surface and a sidewall of the first mask pattern 214. In an embodiment, the first spacer material 120 includes a dielectric material, which may be, for example, silicon oxide, silicon nitride, silicon oxynitride, or a combination thereof. The first spacer material 120 may have a thickness of about 30 nm to about 50 nm, which may be formed using ALD.

It should be noted that, as shown in FIG. 1C, the first mask patterns 214a in the cell region R1 are pillar patterns (from the cross-sectional view of FIG. 2C) or island patterns (from the top view of FIG. 1C) arranged in a hexagonal closed packing configuration. Specifically, a distance D1 of a gap G1 between two adjacent first mask patterns 214a along the Y direction is smaller than a distance D2 of a gap G2 between two adjacent first mask patterns 214a along an X direction. In the case, as shown in FIG. 2C and FIG. 3, the first spacer material 120 has a protrusion portion 120p and a recess portion 120r. The protrusion portion 120p is located in the gap G1 between the two adjacent first mask patterns 214a; and the recess portion 120r is located on two sides of the protrusion portion 120p, as shown in FIG. 2C. A top surface 120t1 of the protrusion portion 120p is higher than a top surface 120t2 of the recess portion 120r. In an embodiment, as shown in FIG. 1C, the recess portion 120r corresponds to a centroid C between three adjacent first mask patterns 214.

On the other hand, the distance D1 of the gap G1 between the two adjacent first mask patterns 214a along the Y direction is also smaller than a distance D3 of a gap G3 between the first mask patterns 214a and 214b along the Y direction. In the case, as shown in FIG. 3, the first spacer material 120 fills up the gap G1 without filling up the gap G3. Therefore, the top surface 120t1 of the first spacer material 120 filled in the gap G1 is higher than the top surface 120t3 of the first spacer material 120 filled in the gap G3.

Figure 1D:
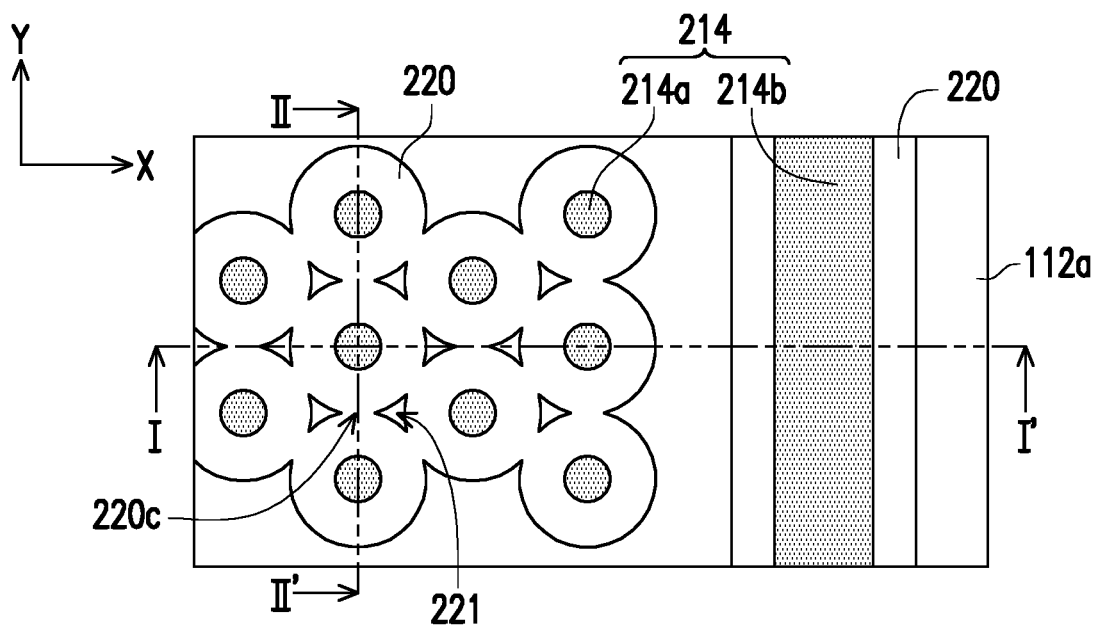
Figure 2D:
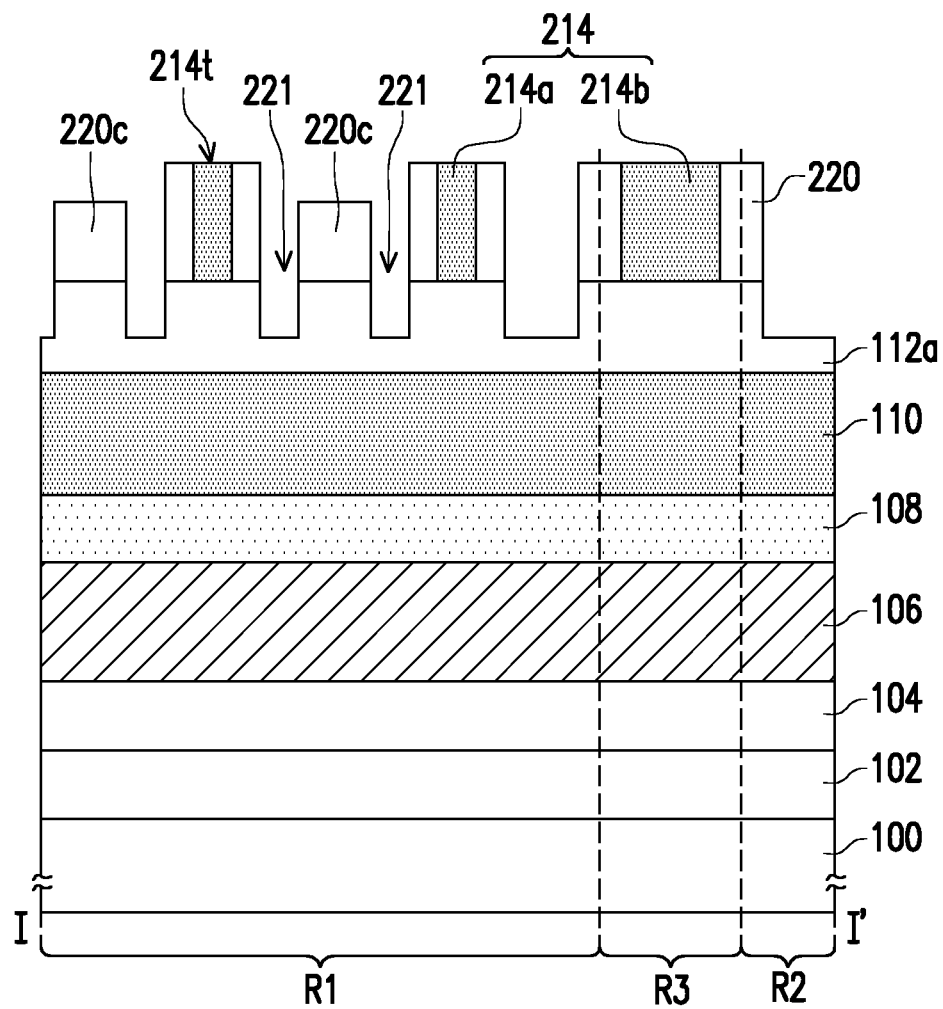
Figure 4:
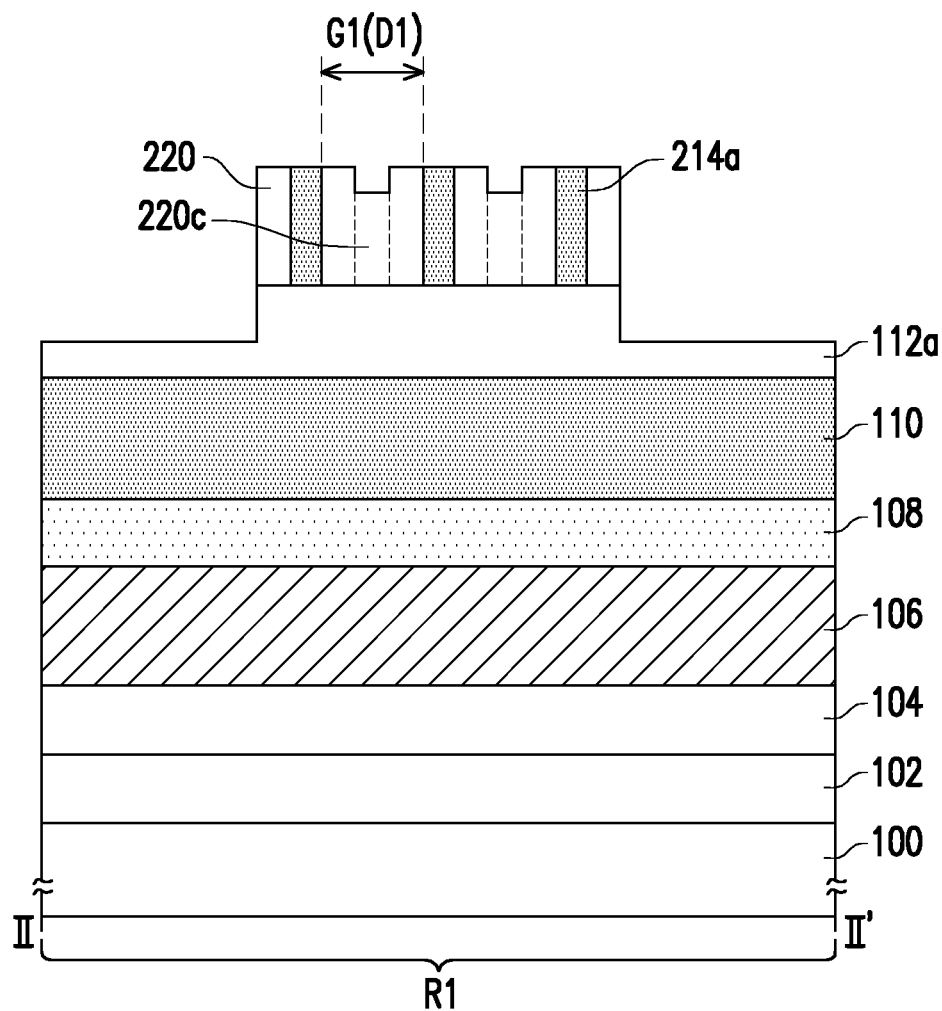
FIG. 4 is a schematic cross-sectional view taken along line II-II' of FIG. 1D.

Referring to FIG. 1C to FIG. 1D, FIG. 2C to FIG. 2D, and FIG. 3 to FIG. 4, an etching process is performed to remove a portion of the first spacer material 120, the anti-reflection layer 116a on the first mask pattern 214, and a portion of the second nitrogen-containing material 112, so as to expose a top surface 214t of the first mask pattern 214. In the case, as shown in FIG. 2D, a first spacer 220 is formed on the sidewall of the first mask pattern 214. A height of the protrusion portion 120p (as shown in FIG. 3) is lowered to form a connection portion 220c (as shown in FIG. 4) that connects the first spacer 220 in the gap G1 between the two adjacent first mask patterns 214a in the Y direction. In addition, the recess portion 120r (a shown in FIG. 2C) and a portion of the second nitrogen-containing material layer 112 thereunder are also removed to form openings 221 (as shown in FIG. 2D). As shown in FIG. 1D, the openings 221 may be referred to as peripheral openings that surrounds the first mask patterns 214a. The etching process may be an anisotropic etching process, such as a reactive ion etching (RIE) process or a dry etching process.

Figure 1E:
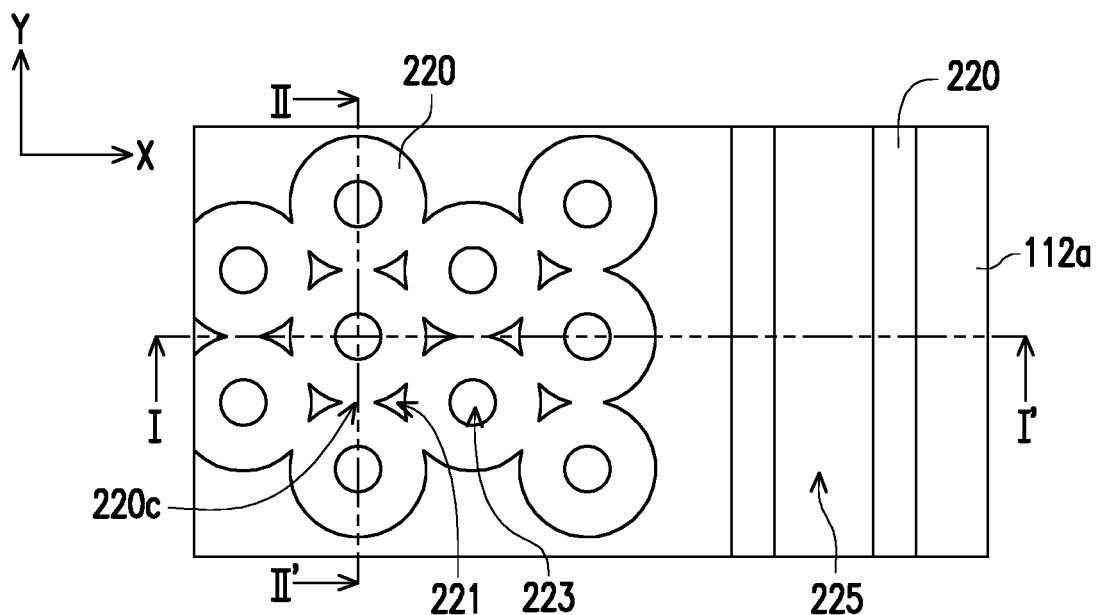
Figure 2E:
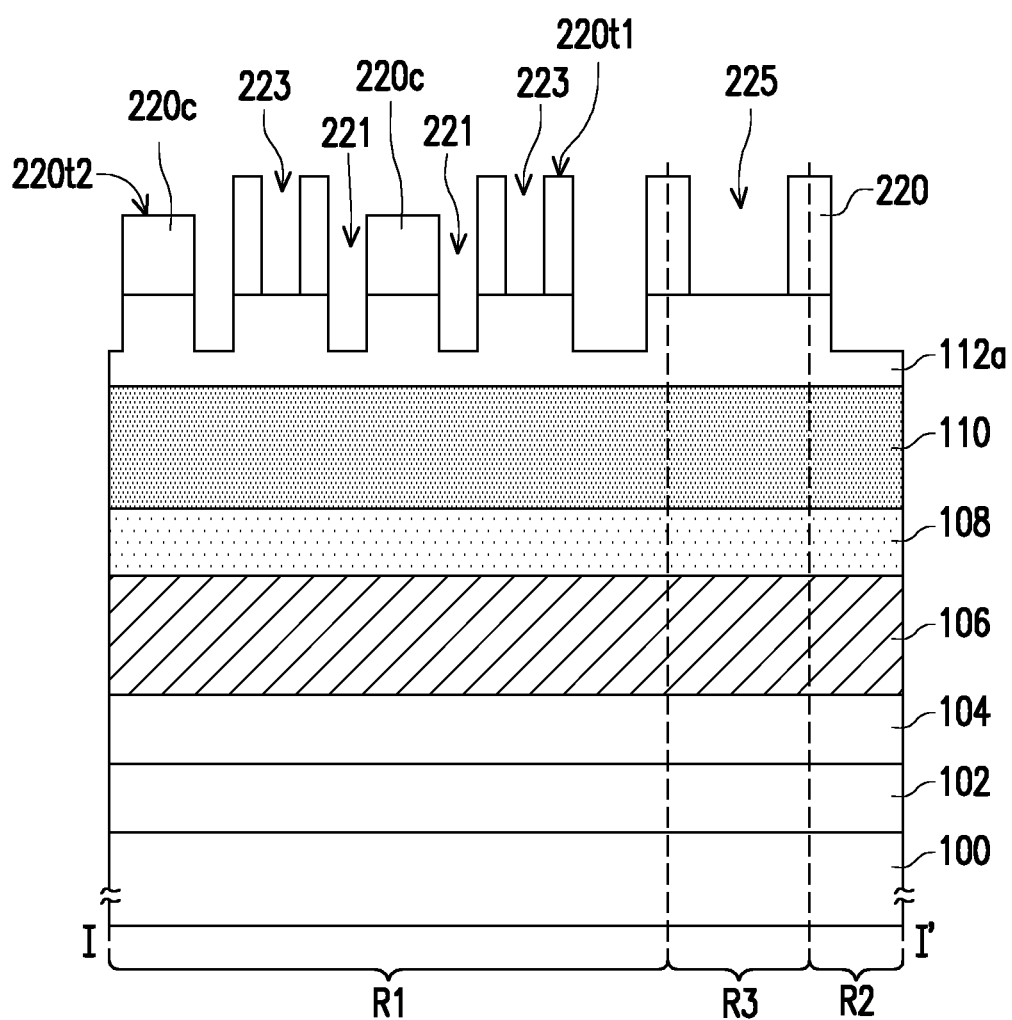

Referring to FIG. 1D to FIG. 1E and FIG. 2D to FIG. 2E, the first mask pattern 214 is removed to form central openings 223 and an opening 225. The peripheral openings 221 surround the central openings 223. It should be noted that, as shown in FIG. 1E, compared with the central openings 223 having circular patterns, the peripheral openings 221 present triangle or triangle-like shapes. In some embodiments, the six peripheral openings 221 are arranged in a radial form with one central opening 223 as a center. In addition, as shown in FIG. 2E, a top surface 220t1 of the first spacer 220 on both sides of the central openings 223 is higher than a top surface 220t2 of the connection portion 220c. On the other hand, the opening 225 may be referred to as a strip-shaped opening located in the guard ring region R3 and extending along the Y direction.

Figure 5A:
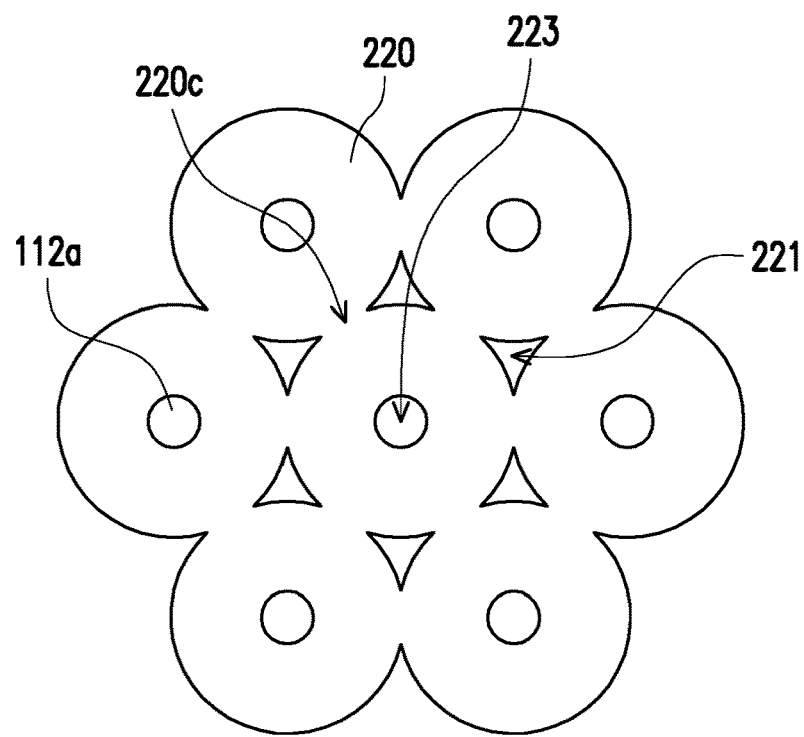
FIG. 5A to FIG. 5C are schematic top views of a rounding process according to an embodiment of the present invention.
Figure 5B:
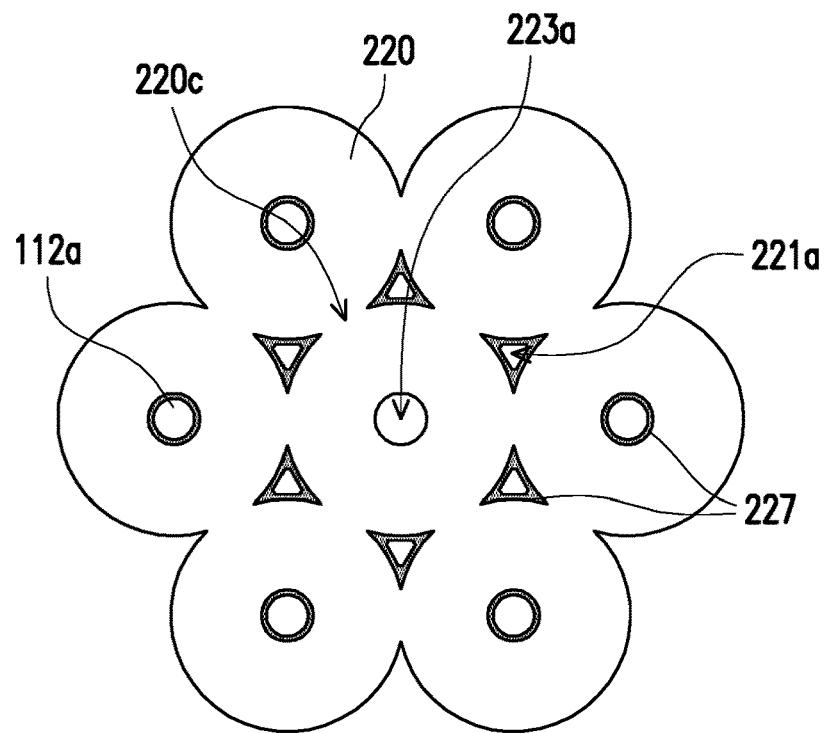
Figure 6:
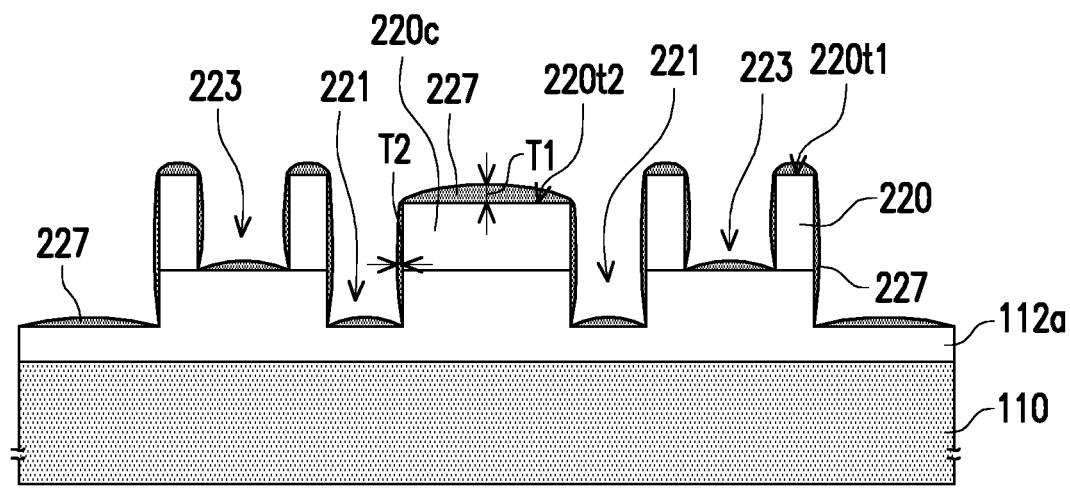
FIG. 6 is an enlarged schematic view of FIG. 2E.

Referring to FIG. 1E to FIG. 1F and FIG. 2E to FIG. 2F, a rounding process is performed to remove a portion of the second nitrogen-containing material layer 112a, so as to form a second mask pattern 212. In some embodiments, the rounding process includes a depositing step and an etching step. Specifically, as shown in FIG. 5A and FIG. 5B, the depositing step is performed to form an oxide layer 227 on sidewalls of the peripheral openings 221. In the case, as shown in FIG. 5B, the oxide layer 227 easily fills up the sharp corners of the peripheral openings 221 having the triangular shapes, so that the deposited peripheral openings 221a become rounded. In addition, the oxide layer 227 is also formed on the sidewalls of the central openings 223, so that the deposited central openings 223a become more rounded. In an embodiment, the depositing step may include using a reactive gas including $SiCl_4$ and $O_2$, so as to form a silicon oxide layer 227. However, the invention is not limited thereto. On the other hand, as seen from the enlarged cross-sectional view of FIG. 6, the oxide layer 227 covers not only the sidewalls of the peripheral openings 221 and the sidewalls of the central openings 223 but also the top surface 220t1 of the first spacer 220 and the top surface 220t2 of the connection portion 220c. In some embodiments, the oxide layer 227 is also formed on bottom surfaces of the peripheral openings 221 and bottom surfaces of the central openings 223 to form a continuous structure that is blanketly cover the structure of FIG. 6. It should be noted that a thickness T1 of the oxide layer 227 on the top surface 220t2 of the connection portion 220c is greater than a thickness T2 of the oxide layer 227 on the sidewall of the connection portion 220c. In this way, the oxide layer 227 can further block the subsequent etching step, thereby prevent two adjacent peripheral openings 221 (especially in an edge region of the cell region R1) from connecting that causes the bridge issue of to-be-formed landing pad structure. That is to say, this oxide layer 227 can effectively increase the process window, thereby improving the yield.

Figure 1F:
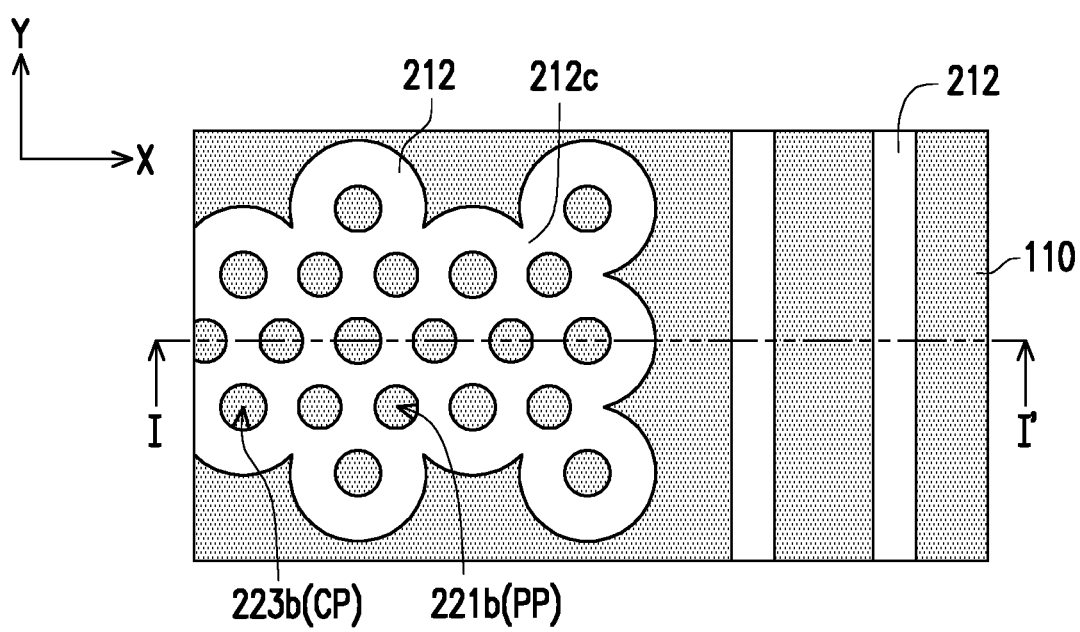
Figure 2F:
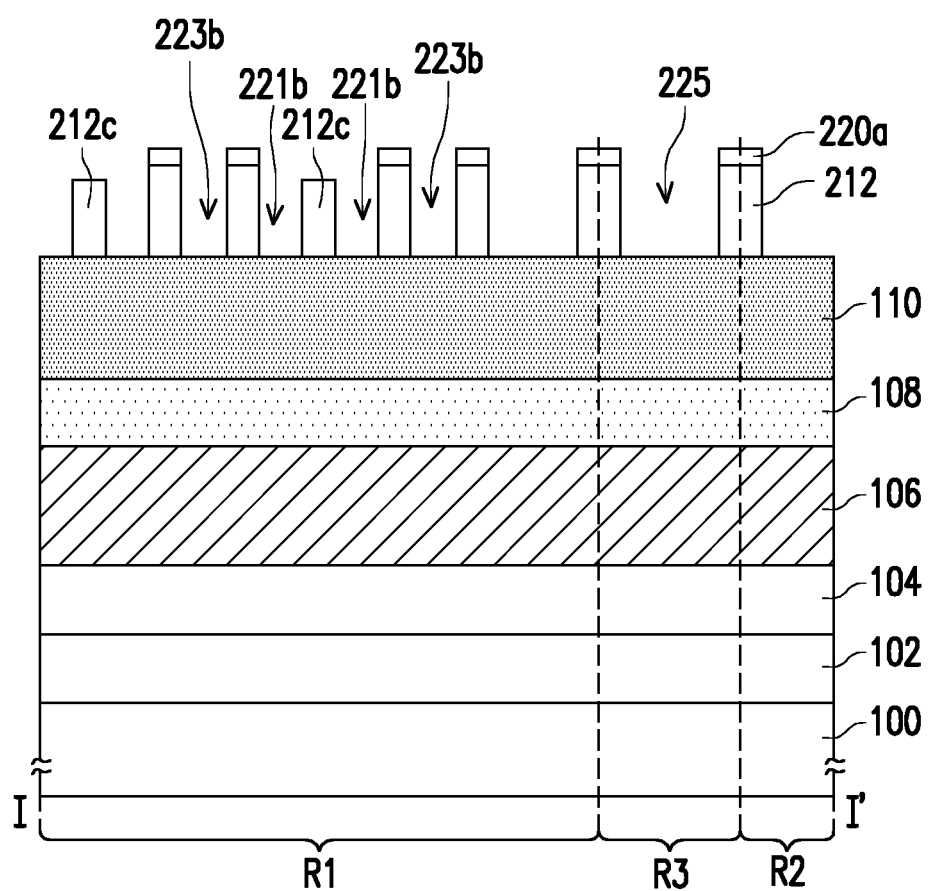
Figure 5C:
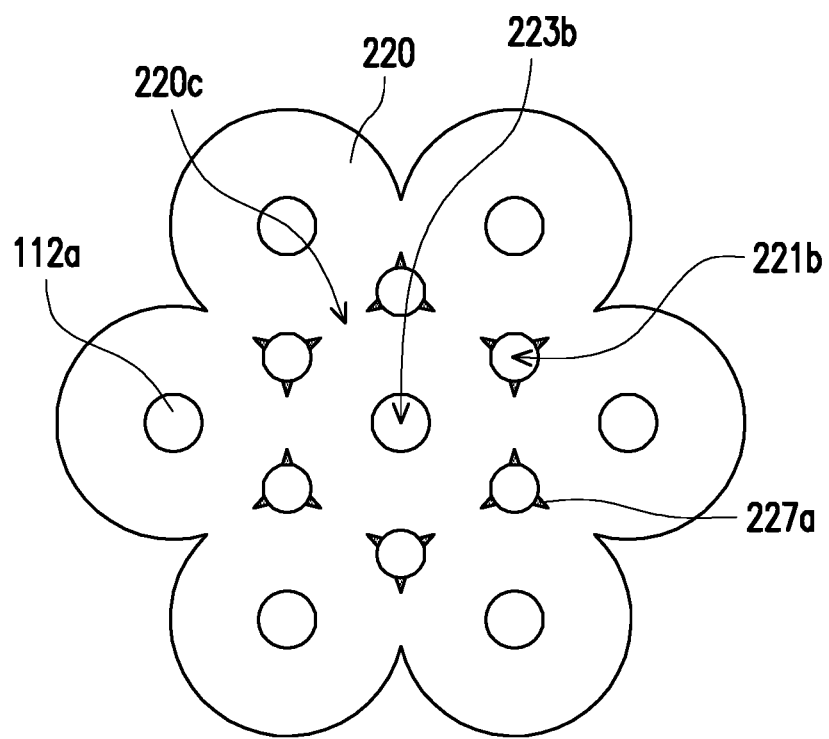

After forming the oxide layer 227, the etching step may be performed to enlarge and round the peripheral openings 221b and the central openings 223b, thereby completing a first cycle, as shown in FIG. 5B and FIG. 5C. In an embodiment, the etching step may include using an etching gas including CH$_3$F and O$_2$, so as to remove the silicon oxide layer 227. However, the invention is not limited thereto. In alternative embodiments, the etching step may include a main-etching step and an over-etching step. The main-etching step has an etching rate with respect to the second nitrogen-containing material layer 112a greater than an etching rate with respect to the oxide layer 227. The over-etching step has an etching rate with respect to the second nitrogen-containing material layer 112a greater than an etching rate with respect to the first carbon-containing material layer 110. In the case, as shown in FIG. 1F and FIG. 2F, the first carbon-containing material layer 110 may be referred to as an etching stop layer for removing the second nitrogen-containing material layer 112a, so that the first carbon-containing material layer 110 is exposed to the second mask pattern 212. In alternate embodiments, after completing the first cycle, as shown in FIG. 5C, a portion of the oxide layer 227a remains around the peripheral openings 221b. In addition, after completing the first cycle, the depositing step and the etching step may be optionally repeated to complete the second cycle. According to actual needs, the second cycle may include a plurality of second loops, such that the peripheral openings 221b and the central openings 223b extend down to the first carbon-containing material layer 110 and reach the desired size. In the case, as shown in FIG. 1F, the peripheral openings 221b and the central openings 223b may be circular openings with an uniform shape. In one embodiment, the peripheral openings 221b and central openings 223b may have a diameter of 30 nm to 40 nm. The standard deviation of the diameter distribution of the peripheral openings 221b and central openings 223b may be less than or equal to 5 nm or between 10% and 15%.

In addition, the connection portion 212c is provided between two adjacent second mask patterns 212 along the Y direction to connect two adjacent second mask patterns 212 in the Y direction. Further, a portion of the first spacer 220a still remains on the second mask pattern 212.

Figure 1G:
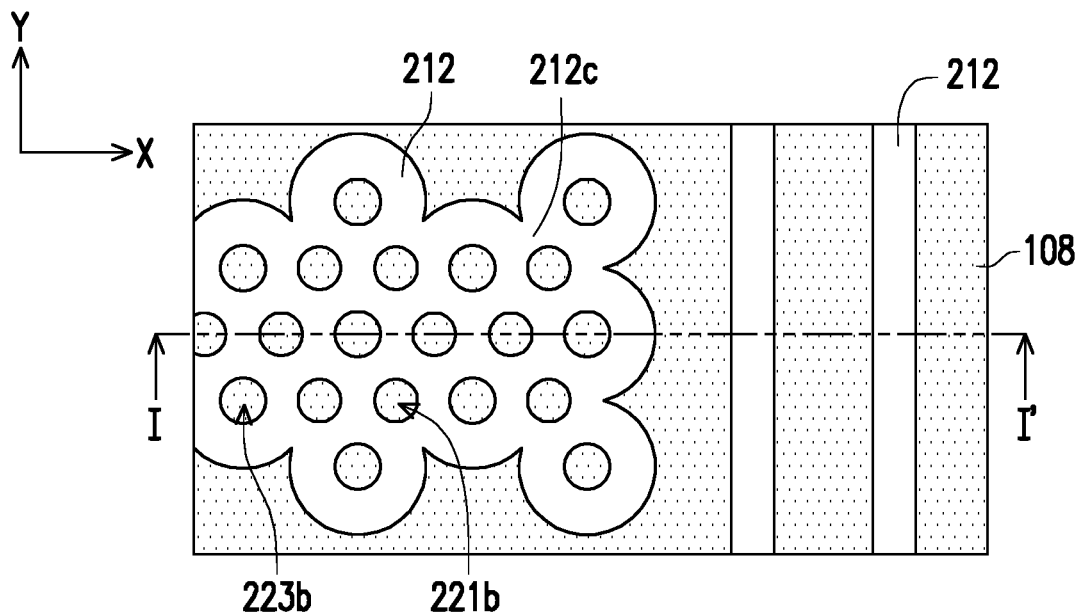
Figure 1H:
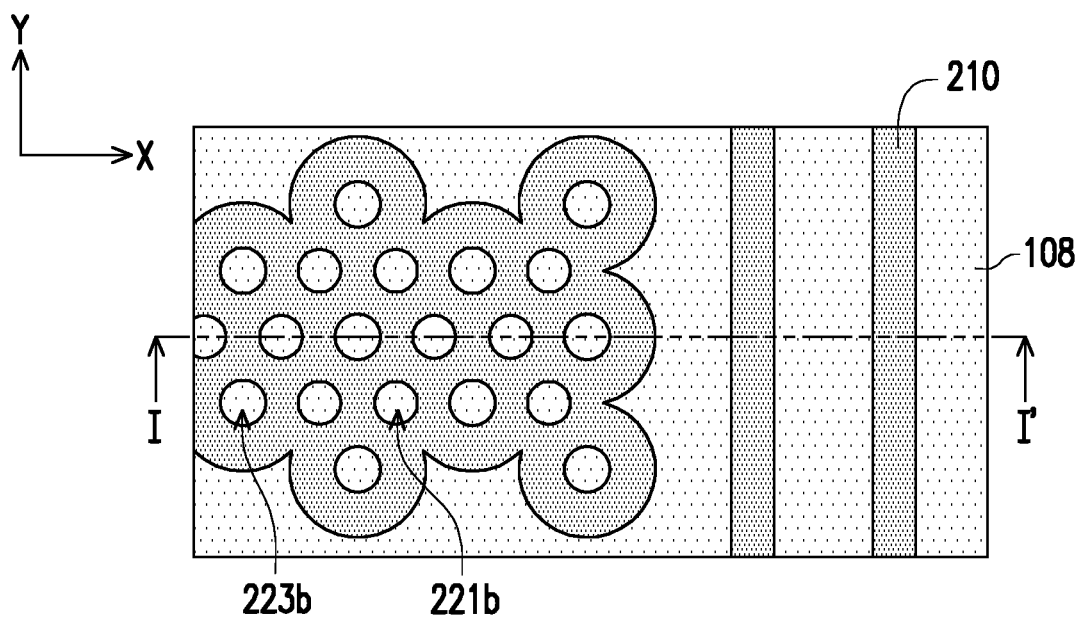
Figure 2G:
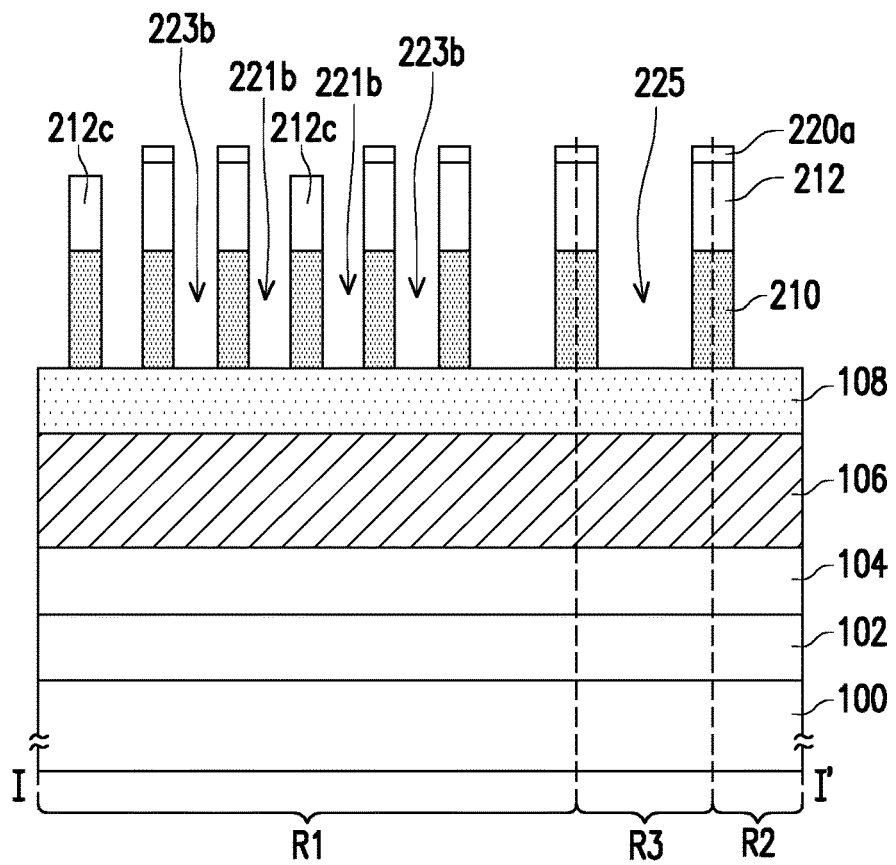
Figure 2H:
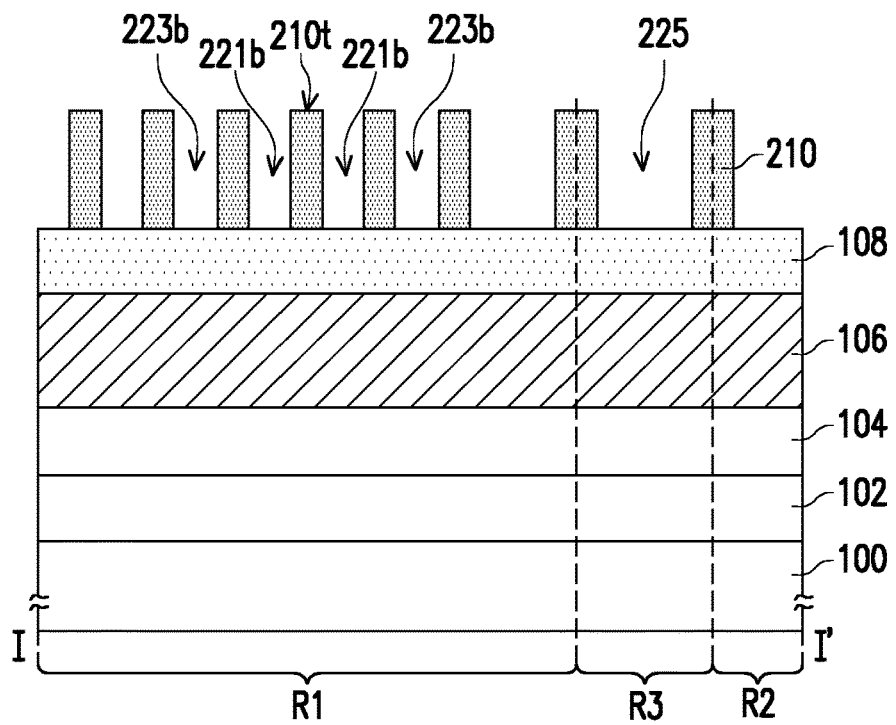

In an embodiment, the manufacturing method by forming the first spacer 220 on the sidewall of the first mask pattern 214 and using the first spacer 220 as the etching mask to increase the pattern density or the feature density may be called a self-alignment double patterning (SADP) process. Particularly, after the SADP process is performed, as shown in FIG. 1F, at least six periphery patterns PP are added around a single center pattern CP (which corresponds to the first mask pattern 214a of FIG. 1C). In other words, the SADP process may increase the integration density of the pattern density or the feature density to overcome the limitation of the resolution of the light source in the current lithography process Referring to FIG. 1F to FIG. 1G and FIG. 2F to FIG. 2G, a portion of the first carbon-containing material layer 110 is removed by using the second mask pattern 212 as a mask to form a third mask pattern 210. In the case, as shown in FIG. 1G and FIG. 2G, the first nitrogen-containing material layer 108 may be referred to as an etching stop layer for removing the first carbon-containing material layer 110, so that the first nitrogen-containing material layer 108 is exposed to the third mask pattern 210. It should be noted that, when the materials of the second mask pattern 212 and the first nitrogen-containing material layer 108 are both silicon nitride, a density of the first nitrogen-containing material layer 108 is greater than a density of the second mask pattern 212. That is, the first nitrogen-containing material layer 108 may be used as an etching stop layer for removing the first carbon-containing material layer 110 without loss or only slight loss the first nitrogen-containing material layer 108.

Referring to FIG. 1G to FIG. 1H and FIG. 2G to FIG. 2H, the second mask pattern 212 and the first spacer 220a on the third mask pattern 210 are removed by a wet etching process to expose a top surface 210t of the third mask pattern 210.

Figure 1I:
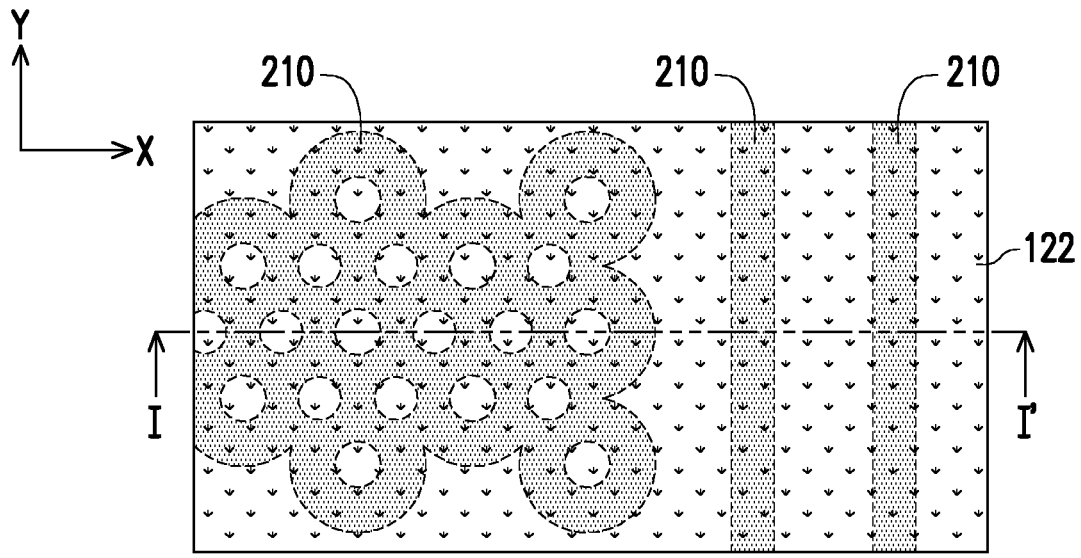
Figure 1J:
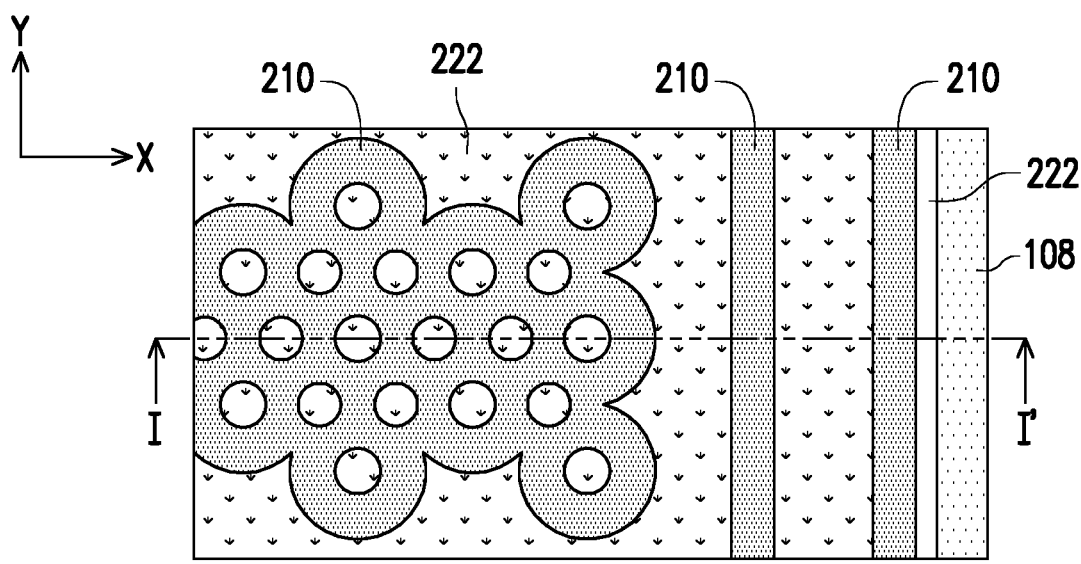
Figure 1K:
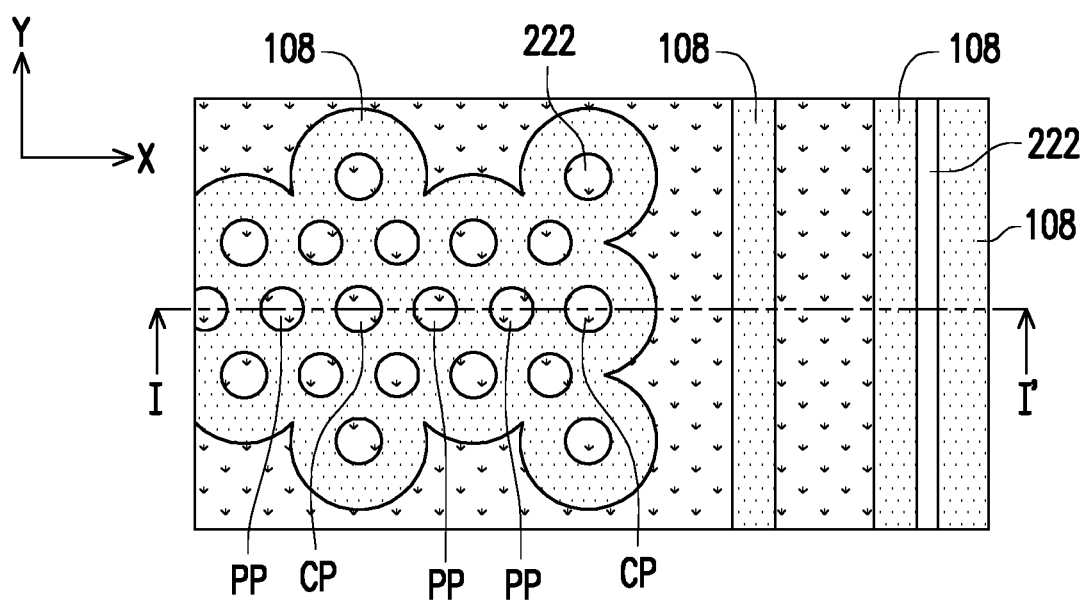
Figure 2I:
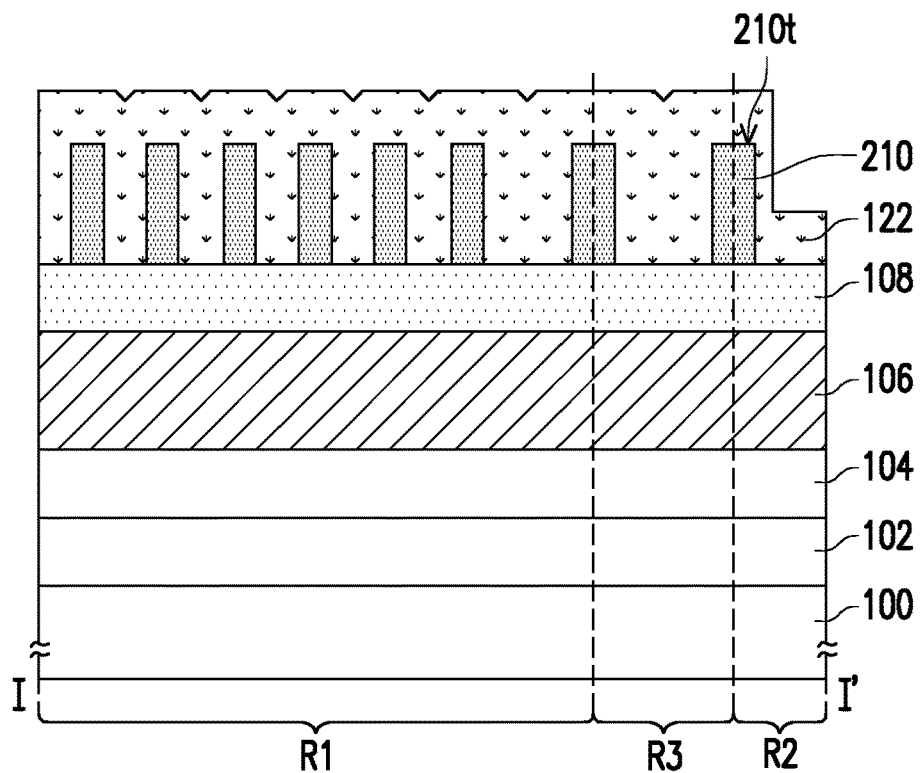

Referring to FIG. 1I and FIG. 2I, a second spacer material 122 is formed on the first nitrogen-containing material layer 108. As shown in FIG. 2I, the second spacer material 122 covers the top surface 210t of the third mask pattern 210 and fills in the gaps in the third mask pattern 210. In one embodiment, the second spacer material 122 includes a dielectric material, which may be, for example, silicon oxide, silicon nitride, silicon oxynitride, or a combination thereof. The second spacer material 122 may have a thickness of about 40 nm to 50 nm, which may be by CVD or ALD.

Figure 2J:
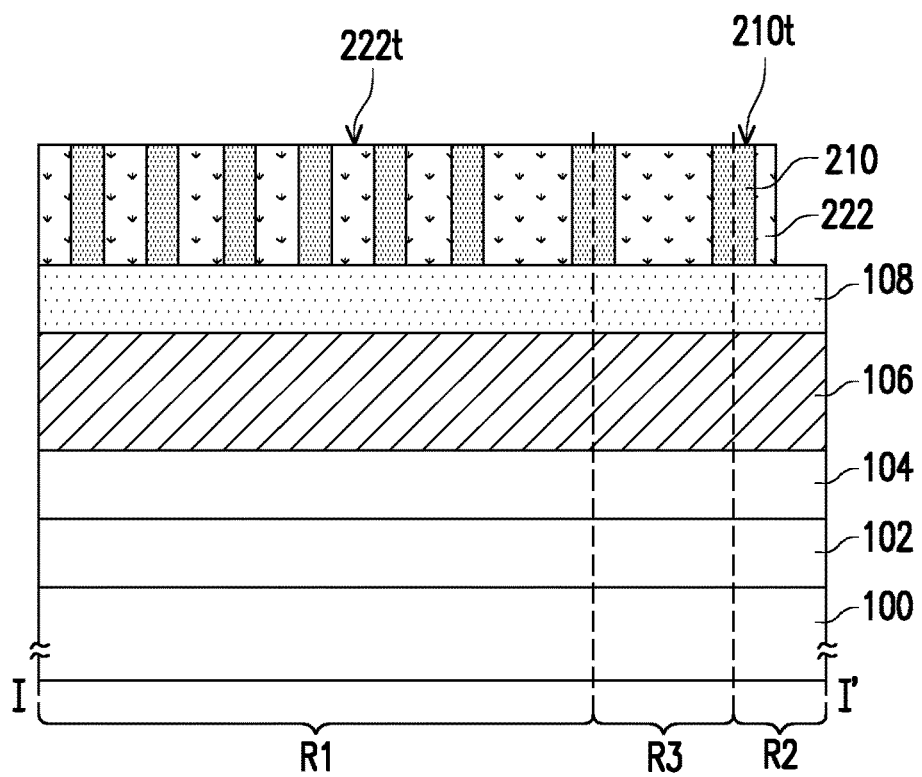

Referring to FIG. 1I to FIG. 1J and FIG. 2I to FIG. 2J, an etch back process is then performed on the second spacer material 122, a portion of the second spacer material 122 is removed to expose the top surface 210t of the third mask pattern 210. In the case, as shown in FIG. 2J, a second spacer 222 is formed in the third mask pattern 210, and a top surface 222t of the second spacer 222 in the cell region R1 is substantially coplanar with the top surface 210t of the third mask pattern 210.

Figure 2K:
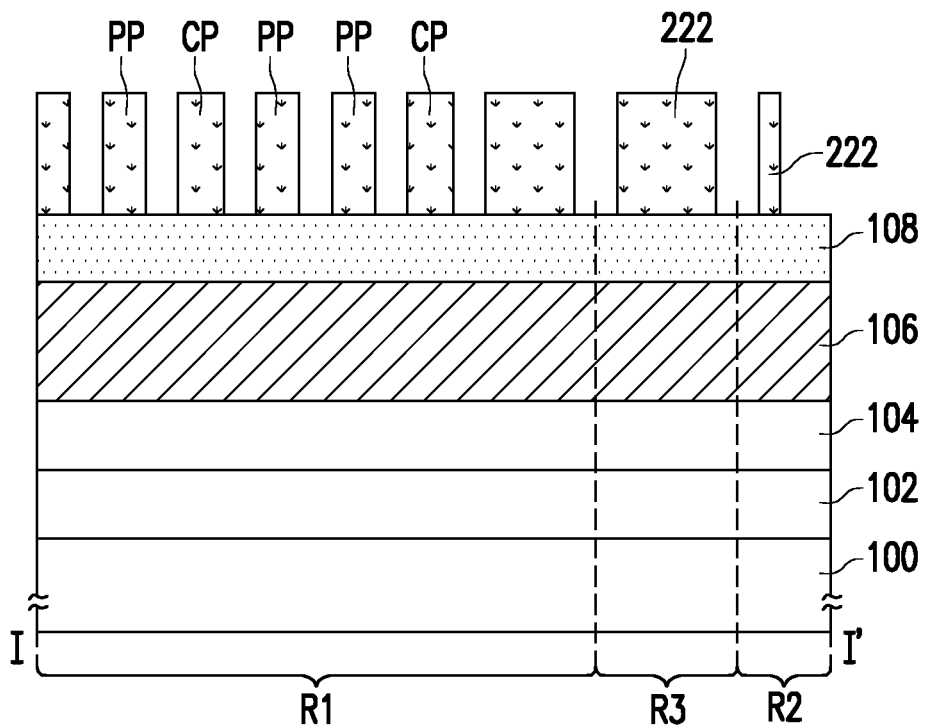

Referring to FIG. 1J to FIG. 1K and FIG. 2J to FIG. 2K, the third mask pattern 210 is removed to expose the top surface of the first nitrogen-containing material layer 108. In the case, as shown in FIG. 2K, the second spacer 222 remaining on the first nitrogen-containing material layer 108 may be used as an etching mask to pattern the underlying first nitrogen-containing material layer 108 and the conductive layer 106, so as to form a plurality of landing pads on the substrate 100 in the cell region R1 and a guard ring on the substrate 100 in the guard ring region R3.

Figure 2L:
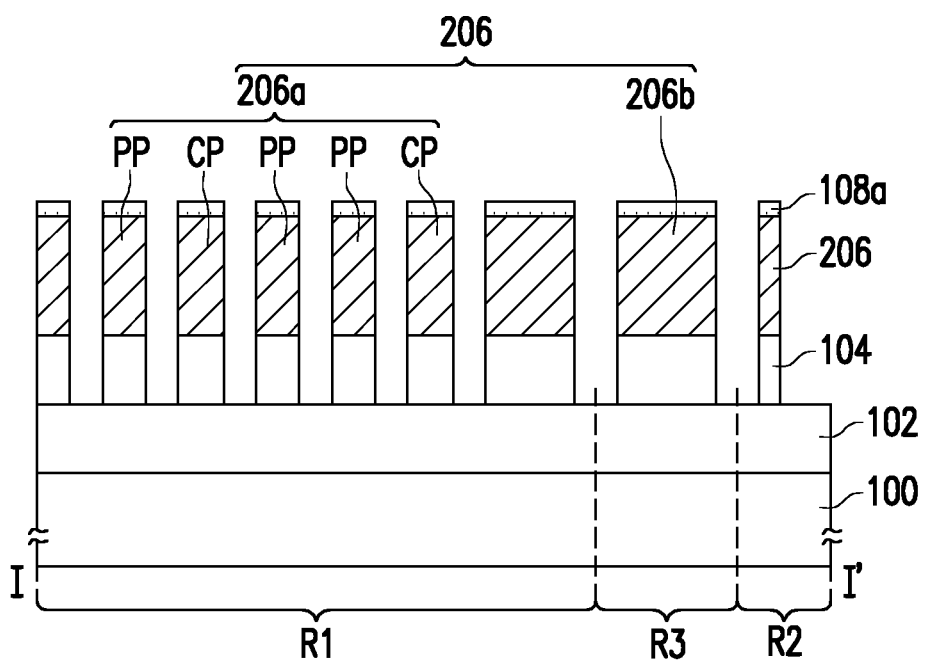
FIG. 2L to FIG. 2N are schematic cross-sectional views of a manufacturing process of a semiconductor structure according to a second embodiment of the invention.

Specifically, after forming the structure of FIG. 2K, as shown in FIG. 2L, a portion of the first nitrogen-containing material layer 108, a portion of the conductive layer 106, and a portion of the barrier layer 104 are removed by using the second spacer 222 as a mask to expose the top surface of the dielectric layer 102. In the case, the patterned conductive layer 206 replicates the pattern of the second spacer 222 to form landing pads 206a and a guard ring 206b. The landing pads 206a are located in the cell region R1, and the guard ring 206b is located in the guard ring region R3. In some embodiments, the landing pads 206a include a central pattern CP and peripheral patterns PP surrounding the central pattern CP. In another embodiment, the landing pads 206a and the guard ring 206b are formed simultaneously and have the same material. In addition, as shown in FIG. 2L, a portion of the first nitrogen-containing material layer 108a still remains on the top surface of the patterned conductive layer 206. In some embodiments, the central pattern CP and the peripheral patterns PP have a diameter of 30 nm to 40 nm. The standard deviation of the diameter distribution of the central pattern CP and the peripheral patterns PP may be less than or equal to 5 nm or between 10% and 15%.

Figure 2M:
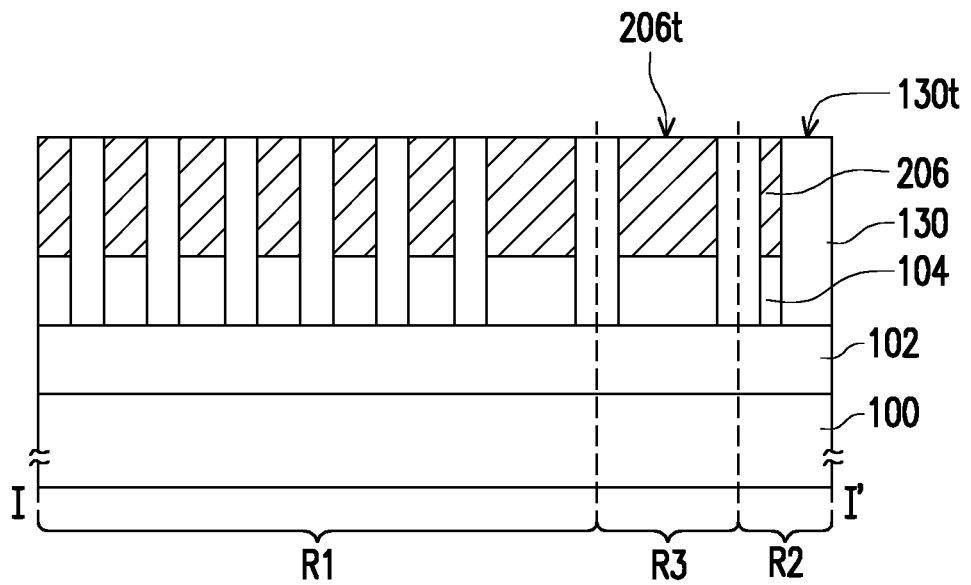

Referring to FIG. 2L and FIG. 2M, a dielectric material (not shown) is formed on the dielectric layer 102 to fill in the gaps in the patterned conductive layer 206 and cover the top surface 206t of the patterned conductive layer 206. Next, an etch back process is performed to remove a portion of the dielectric material and the first nitrogen-containing material layer 108a, thereby exposing the top surface 206t of the patterned conductive layer 206. In the case, as shown in FIG. 2M, the top surface 206t of the patterned conductive layer 206 and the top surface 130t of the dielectric layer 130 are substantially coplanar. In some embodiments, a material of the dielectric layer 130 includes silicon oxide, silicon nitride, silicon oxynitride, or a combination thereof.

Figure 2N:
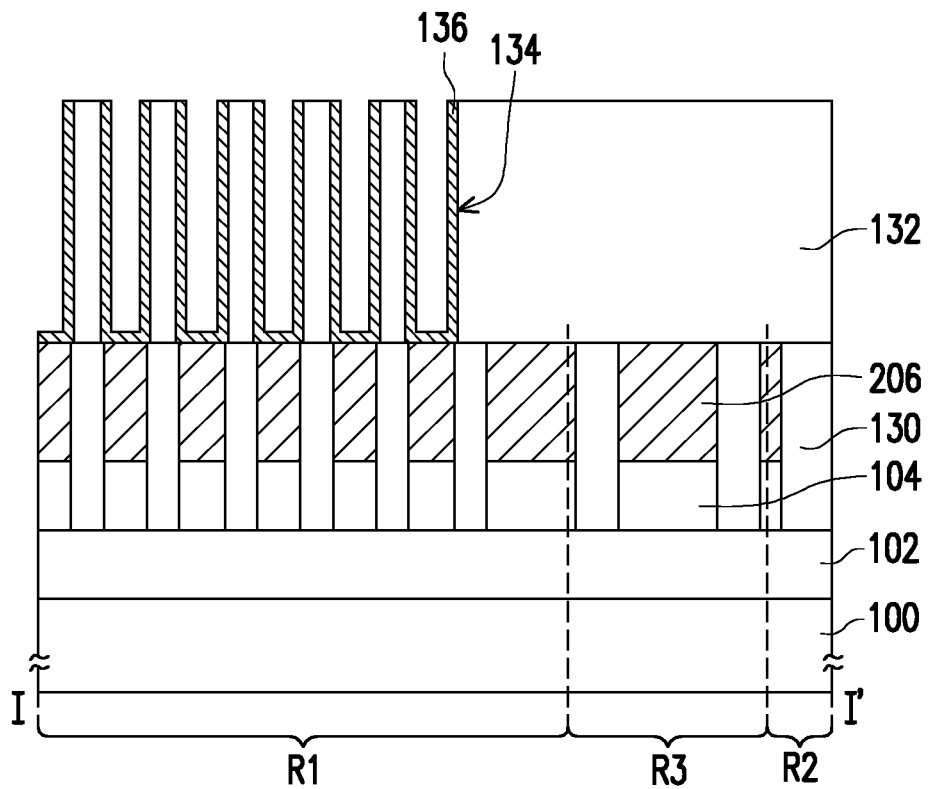

Referring to FIG. 2M and FIG. 2N, after performing the etch back process, another dielectric layer 132 may be formed on the dielectric layer 130. Next, a plurality of capacitor openings 134 are formed in the dielectric layer 132, and a plurality of capacitors 136 are formed in the capacitor openings 134, respectively. Specifically, each of the capacitors 136 may include a lower electrode, an upper electrode, and a capacitor dielectric layer between the lower electrode and the upper electrode (not shown). In an embodiment, a material of the dielectric layer 132 may be, for example, silicon oxide. A material of the lower electrode and the upper electrode is, for example, titanium nitride, tantalum nitride, tungsten, titanium tungsten, aluminum, copper or metal silicide. The capacitor dielectric layer may include a high dielectric constant material layer (i.e., a dielectric material having a dielectric constant higher than 4), which may be, for example, an oxide of the following elements such as hafnium, zirconium, aluminum, titanium, lanthanum, yttrium, gadolinium, or tantalum, or aluminum nitride, or any combination of the above.

In the embodiment, as shown in FIG. 2N, the landing pads 206a in the cell region R1 may be regarded as capacitor contacts to electrically connect the capacitors 136 and the active regions (not shown). However, the present invention is not limited thereto. In other embodiments, the above-described patterning method can also be applied to different semiconductor structures to increase the integration density of the pattern density or feature density.

For example, an embodiment of the present invention may provide another patterning method including following steps. A target layer, a first layer, a second layer, a third layer, and a first mask pattern are sequentially formed on a substrate. A first spacer is formed on a sidewall of the first mask pattern. The first mask pattern is removed to form a plurality of central openings and a plurality of peripheral openings surrounding the central openings in the first spacer. A rounding process is performed to round the peripheral openings and form a second mask pattern. A portion of the second layer is removed by using the second mask pattern as a mask to form a third mask pattern. A second spacer is formed in the third mask pattern. The third mask pattern is removed. A portion of the first layer and a portion of the target layer are removed by using the second spacer as a mask, so as to form a target pattern. In the present embodiment, the pattern density of the target pattern may be greater than the pattern density of the first mask pattern to effectively increase the integration density of the semiconductor structure. In some embodiments, the target pattern may have a diameter of 30 nm to 40 nm. In addition, the standard deviation of the diameter distribution of the target pattern may be less than or equal to 5 nm or between 10% and 15%.

In summary, in the embodiment of the present invention, a plurality of target patterns are simultaneously formed by using the composite layer stacking with a double patterning process. The plurality of target patterns are arranged in the hexagonal close packing configuration, which can effectively improve the integration density of the semiconductor structure. In addition, in the embodiment of the present invention, the peripheral openings may become more circular by using the rounding process, so that the peripheral openings and the central openings have an uniform size or shape. Further, the oxide layer formed by the rounding process can further block the subsequent etching step, thereby preventing two adjacent peripheral openings (especially in the edge region of the cell region) from connecting that causes the bridge issue of to-be-formed semiconductor structure. In other words, the embodiment of the present invention can effectively increase the process window, thereby improving the yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A patterning method, comprising:
   sequentially forming a conductive layer, a first nitrogen-containing material layer, a first carbon-containing material layer, a second nitrogen-containing material layer, a second carbon-containing material layer, and a photoresist pattern on a substrate;
   removing a portion of the second carbon-containing material layer by using the photoresist pattern as a mask, so as to form a first mask pattern;
   forming a first spacer on a sidewall of the first mask pattern;
   removing the first mask pattern to form a central opening and a plurality of peripheral openings surrounding the central opening in the first spacer; and
   performing a rounding process to remove a portion of the second nitrogen-containing material layer and make the plurality of peripheral openings become rounded, so as to form a second mask pattern.

2. The patterning method according to claim 1, wherein the performing the rounding process comprises:
   performing a depositing step to form an oxide layer on sidewalls of the plurality of peripheral openings; and
   performing an etching step to enlarge and round the plurality of peripheral openings, so as to complete a first cycle.

3. The patterning method according to claim 2, wherein the depositing step comprises using a reactive gas comprising $SiCl_4$ and $O_2$, and the oxide layer is silicon oxide.

4. The patterning method according to claim 2, wherein the etching step comprises using an etching gas comprising $CH_3F$ and $O_2$.

5. The patterning method according to claim 4, wherein the etching step comprises:

a main-etching step having an etching rate with respect to the second nitrogen-containing material layer greater than an etching rate with respect to the oxide layer; and an over-etching step having an etching rate with respect to the second nitrogen-containing material layer greater than an etching rate with respect to the first carbon-containing material layer.

6. The patterning method according to claim 2, wherein the oxide layer covers a top surface and a sidewall of the first spacer, and a thickness of the oxide layer on the top surface of the first spacer is greater than a thickness of the oxide layer on the sidewall of the first spacer.

7. The patterning method according to claim 2, wherein the oxide layer further covers bottom surfaces of the plurality of peripheral openings and a bottom surface of the central openings to form a continuous structure.

8. The patterning method according to claim 2, further comprising repeating the depositing step and the etching step to complete a second cycle after completing the first cycle.

9. The patterning method according to claim 1, wherein the substrate comprises a cell region, a periphery region, and a guard ring region between the cell region and the periphery region.

10. The patterning method according to claim 9, wherein the first mask pattern formed in the cell region comprises a plurality of pillar patterns arranged in a hexagonal close packing configuration.

11. The patterning method according to claim 9, further comprising:

removing a portion of the first carbon-containing material layer by using the second mask pattern as a mask to form a third mask pattern;

forming a second spacer in the third mask pattern; and removing the third mask pattern.

12. The patterning method according to claim 11, further comprising: removing a portion of the first nitrogen-containing material layer and a portion of the conductive layer by using the second spacer as an etching mask, so as to form a plurality of landing pads on the substrate in the cell region.

13. The patterning method according to claim 12, wherein the forming the plurality of landing pads on the substrate in the cell region further comprises: forming a guard ring on the substrate in the guard ring region.

14. The patterning method according to claim 13, wherein the plurality of landing pads and the guard ring are simultaneously formed and have the same material.

\* \* \* \* \*